(12) United States Patent
Schambacher et al.

(10) Patent No.: US 6,191,631 B1
(45) Date of Patent: Feb. 20, 2001

(54) ELECTRIC CIRCUIT COMPRISING AT LEAST ONE SWITCHED CAPACITOR AND METHOD OF OPERATING SAID CIRCUIT

(75) Inventors: Jörg Schambacher, München; Peter Kirchlechner, Hohenthann; Jürgen Lübbe, Jacobneuharting, all of (DE)

(73) Assignee: STMicroelectronics, S.r.l., Agrate Brianza (IT)

( * ) Notice: Under 35 U.S.C. 154(b), the term of this patent shall be extended for 0 days.

(21) Appl. No.: 09/203,552

(22) Filed: Dec. 1, 1998

(30) Foreign Application Priority Data

Dec. 1, 1997 (DE) .............................................. 197 53 279

(51) Int. Cl.[7] .................................................. G11C 27/02
(52) U.S. Cl. .............................................. 327/291; 327/91
(58) Field of Search ................................ 327/91, 93, 94, 327/95, 96, 291, 295

(56) References Cited

U.S. PATENT DOCUMENTS 4,417,158   11/1983   Ito et al. ............................... 327/295
4,823,027 * 4/1989   Takahashi ............................ 307/353
5,892,387 * 4/1999   Shigehara et al. ................... 327/537

FOREIGN PATENT DOCUMENTS 36 36 757 A1   10/1987   (DE) .
3-204222        9/1991   (JP) .

* cited by examiner

Primary Examiner—Toan Tran
Assistant Examiner—Linh Nguyen
(74) Attorney, Agent, or Firm—Theodore E. Galanthay; Robert Iannucci; Seed IP Law Group, PLLC

(57) ABSTRACT

In an integrated circuit comprising a so-called "switched" capacitor, the latter is switched by a parallel circuit of two complementary switching transistors having mutually complementary switching pulse trains. Due to parasitic effects during this switching operation, disturbing offset voltages arise at the switched capacitor. In order to avoid such offset voltages, the edges of the one switching pulse train are shifted in time with respect to the corresponding edges of the complementary switching pulse train. To this end, a switching pulse generator contains a delay member fed with a control signal which is formed by means of a constant reference voltage using a dummy or simulation of that circuit that contains the switched capacitor.

17 Claims, 4 Drawing Sheets

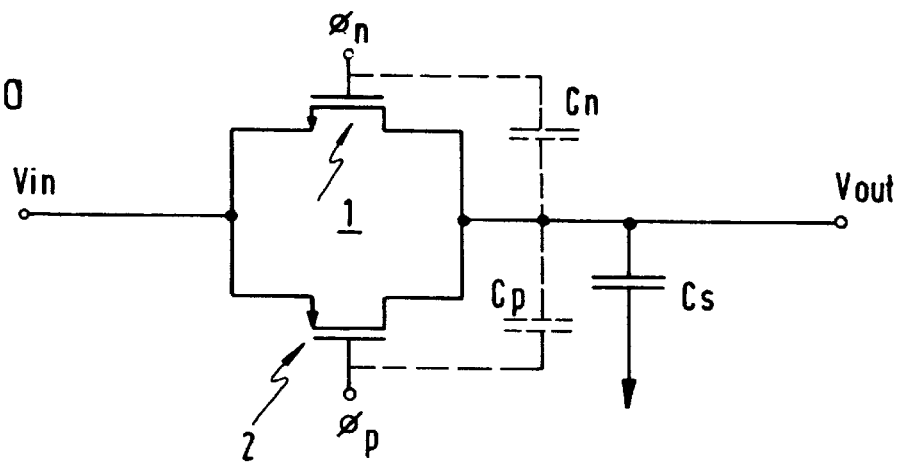
FIG.1a
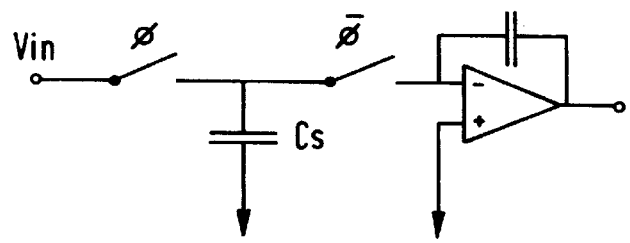
FIG.1b
FIG.2
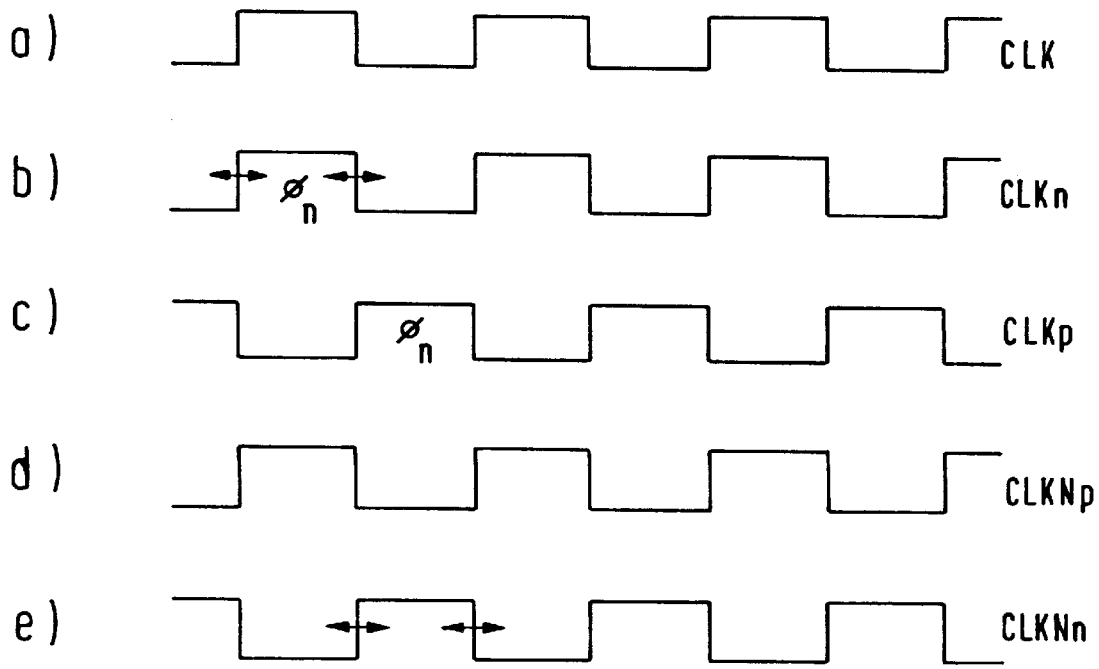

ELECTRIC CIRCUIT COMPRISING AT LEAST ONE SWITCHED CAPACITOR AND METHOD OF OPERATING SAID CIRCUIT

TECHNICAL FIELD

The invention relates to an electric circuit comprising at least one so-called switched capacitor. The invention furthermore relates to a method of operating such an electric circuit.

The invention is concerned specifically with an electric circuit comprising at least one switched capacitor which is switched via a parallel circuit having two electronic complementary switches controlled by complementary switching pulses, said circuit comprising a switching signal generator receiving a basic clock signal and generating therefrom a first switching pulse train as well as an almost complementary second switching pulse train. Moreover, the invention is concerned with a method of operating such an electric circuit.

BACKGROUND OF THE INVENTION

It is known in integrated circuits to realize specific functions with the aid of so-called switched capacitors (SC), for instance the function of an ohmic resistor. As is known, the impedance of a capacitor is calculated fiom the reciprocal value of the product of frequency and capacitance. Accordingly, for simulating ohmic resistors, integrated capacitors are controlled via switches, so that a continuous reloading operation takes place at the capacitor. The frequency of the control signal is matched to the capacitance of the capacitor such that the desired impedance is obtained.

By simulating ohmic resistors with the aid of switched capacitors, considerable chip area savings can be achieved.

For switching a "switched capacitor", an insulated gate field effect transistor (IGFET) is usually employed, and in particular two complementary field effect transistors (CMOS field effect transistors) connected in parallel to each other are employed.

SUMMARY OF THE INVENTION

The present invention deals with problems in controlling a switched capacitor having complementary transistor switches controlled by complementary switching pulse trains.

FIG. 1a shows a switched capacitor $C_s$ comprising a first switching transistor 1 controlled by a switching signal øn and having a second switching transistor connected thereto which is complementary to the first switching transistor and controlled by a complementary switching signal øp. By the complementary control of the complementary transistors, both transistors are either simultaneously closed or simultaneously opened.

FIG. 1b shows a schematic diagram of a circuit within an integrated circuit comprising a switched capacitance $C_s$ having a transistor switch connected upstream thereof and a transistor switch connected downstream thereof each. Following the switched capacitance is an operational amplifier. The circuit shown in FIG. 1a corresponds to the switching capacitance $C_s$ along with the switch connected upstream thereof which is controlled by switching pulse train ø, with ø in FIG. 1b comprising both signals øn and øp. The switch shown in FIG. 1b, which is controlled by signal ø, can be designed in similar manner as the parallel circuit of two complementary MOS field effect transistors shown in FIG. 1a.

FIG. 1a shows in broken lines parasitic capacitances $C_n$ and $C_p$. These parasitic capacitances are constituted by the gatesourcc capacitance of the first switching transistor 1 and the second switching transistor 2, respectively. When these two parasitic capacitances $C_n$ and $C_p$ have the same value and simultaneous blocking and simultaneous opening of the transistor switches 1 and 2 takes place, capacitor $C_s$ charges or discharges in the predetermined manner, respectively. However, an offset voltage arises at capacitor $C_s$ when the two capacitances $C_n$ and $C_p$ are different from each other:

$$\Delta Q_{pn} = (C_p - C_n)\Delta U$$
$$= \Delta C_{pn} \cdot \Delta U$$
$$\Delta C_{pn} = 0\} \Delta Q_{pn} = 0$$

(} means: from which follows)

From the above equation, a residual charge of 0 results for $C_s$ when $C_p$ has the same value as $C_n$, whereas otherwise a residual charge different from 0 results. The above influence of the parasitic capacitances $C_n$ and $C_p$ is also referred to as "clock feedthrough".

A further factor affecting the exact operation of the switched capacitor is the so-called charge transfer which arises due to the fact that the switching time on opening and closing of the two switching transistors 1 and 2 in FIG. 1 is different for the two switching transistors.

FIG. 3 shows in the upper part the signal patterns for the switching pulses øn and øp, respectively, and it can be seen therefrom that in practical application the signal edges are not perpendicular to the time axis, but extend in oblique manner. In the lower part of FIG. 3, the output voltage $V_{out}$ of the switching arrangement according to FIG. 1a is shown. In the ideal case, the output voltage $V_{out}$ at capacitor $C_s$ should retain the previous value after switching over of the two switching transistors 1 and 2. However, in reality an offset (offset voltage) results, having the value $\Delta U_{cs} = \Delta Q/C_s$.

This offset voltage is due to different switching thresholds of the two switching transistors 1 and 2 (or of the n-channel or p-channel in case of a CMOS field effect transistor).

As can be seen from the top of FIG. 3, the descending edge of switching pulse on reaches the switching time according to threshold voltage $V_{Tn}$ earlier than the switching time of switching transistor 2, with respect to which the switching signal øp reaches the threshold value $V_{Tp}$ relatively late.

FIG. 4 shows the circuit according to FIG. 1b for the moment of time depicted in FIG. 3. At first, switching transistor 1 closes in the course of the trailing edge of signal on, so that the resistance of this switch Roffn is very high (the resistance between drain and source of switching transistor 1).

Due to the fact that the lower switching transistor 2 is not yet closed, the on-resistance Ronp (the resistance between drain and source of switching transistor 2) still is much lower than the off resistance Roffn of first switching transistor 1.

The following situation now results for the then effective parasitic capacitances:

Between the gate of switching transistor 1 and the output node of the circuit, there is a capacitance $C_{CFN}$ (CF stands for "clock feedthrough"). Between the gate of lower switching transistor 2 and the output node of the circuit, a capacitance of $$C_{CFP} + C_{CTP}$$

results (wherein CT stands for "charge transfer").

While in the channel of switching transistor 1 no more charge is stored, no compensation of the charge stored in the p-channel of switching transistor 2 takes place. The residual charge thus is calculated as follows:

$$\Delta Q = (C_{CT} + C_{CFP})V_{TN} - C_{CFN} \cdot V_{TN}$$

$$\approx C_{CT} \cdot V_{TN}$$

In order to avoid the offset voltages arising due to the above processes and facts, the present invention suggests to regulate or control the edges of the switching pulse trains in such a manner that a complete compensation (when disregarding a remaining regulating deviation) of the offset voltage is obtained.

The invention to this end provides a method of operating a circuit comprising a switched capacitor, in which at least the leading edge and/or the trailing edge preferably of at least one of the complementary switching pulses (e.g., øn) can be controlled in such a manner that it is shifted in accordance with the output voltage of the switches (1, 2) arranged in parallel with respect to the associated edge of the other one of the complementary switching pulse signals (øp). The electronic switches are preferably complementary MOS-FETs.

Such edge regulation or control is conceivable in the form of an alteration of the edge steepness. However, this is possibly difficult to realize in terms of circuit technology. The edge to be controlled therefore is shifted in time, in such a manner that both switches reach the blocking state virtually at the same time.

The invention furthermore provides an electric circuit comprising at least one switched capacitor which, via a parallel circuit of two electronic complementary switches, is switched by two complementary switching pulse trains generated by a switching pulse generator from a basic clock signal. For controlling the leading edge and/or trailing edge at least of the one switching pulse train, the circuit contains the following:

a control circuit which receives the two switching pulse trains and, using a reference signal, delivers a control signal, and a delay circuit within the switching pulse generator, which receives the control signal and delays the first and/or the second switching pulse train in accordance with the control signal.

In a preferred embodiment of the invention, the delay circuit is arranged in the output circuit for the first switching pulse train. The second switching pulse train then remains unchanged as it is when it is delivered by the switching pulse generator, and only the first switching pulse train is delayed in relation to the second switching pulse train.

A typical application for switched capacitors are filter circuits. Such a filter circuit comprising, for example, an operational amplifier having in its feedback loop a capacitor and in its input loop a resistor simulated by a switched capacitor, is utilized according to the invention as control circuit in the form of an "dummy structure". Depending on whether the output signal obtained by this "dummy structure" is greater than or smaller than a reference signal, the edges of the one switching pulse train are delayed to a larger or lesser extent, with the aim of bringing both switching transistors to the blocking state simultaneously.

In the following, embodiments of the invention will be elucidated in more detail by way of the drawings in which

BRIEF DESCRIPTION OF THE DRAWINGS

FIG. 1 a shows a circuit diagram comprising a switched capacitor and an electronic switch connected upstream thereof and consisting of two complementary switching transistors;

FIG. 1b shows a diagram of a filter circuit in the input circuit of which an ohmic resistor is simulated by a switched capacitor having an electronic switch upstream and downstream thereof;

FIG. 2 shows pulse diagrams for switching pulse trains controlling the two switching transistors 1 and 2 in FIG. 1a as well as two switching transistors complementary thereto;

Figure 5:
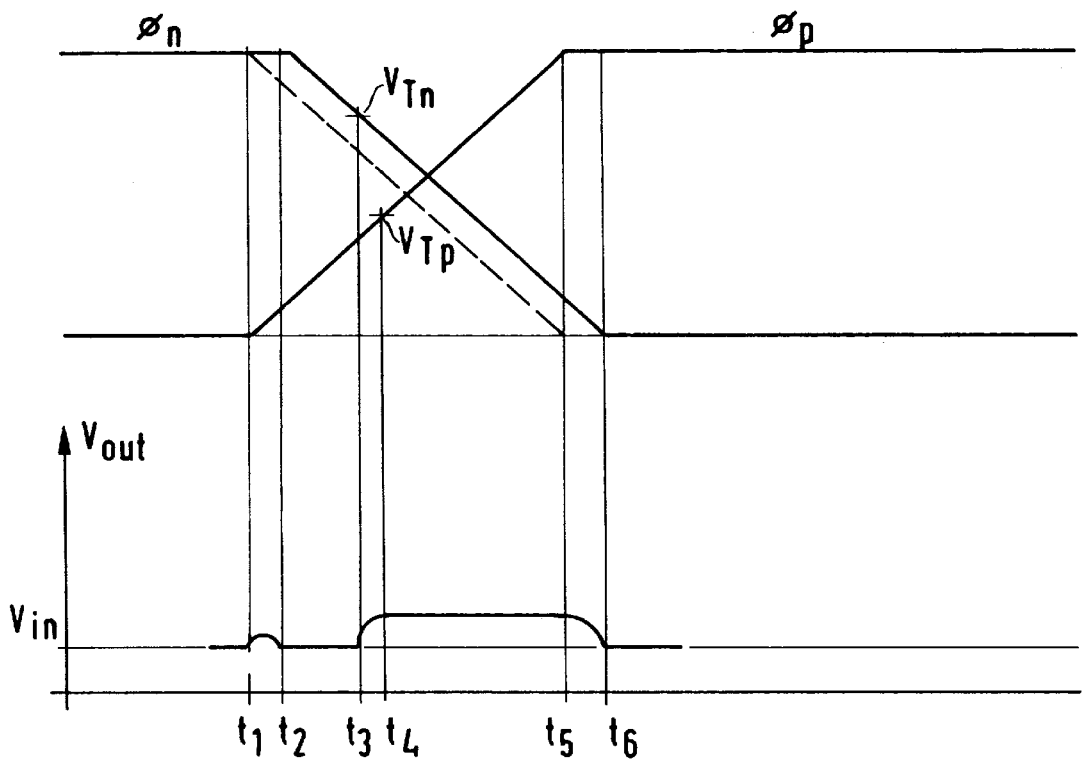
FIG. 5 shows a waveform diagram similar to that in FIG. 3, however for switching pulses controlled in accordance with the invention.

The mode of operation and functioning of the circuit according to the invention and the method according to the invention shall be elucidated first by way of FIG. 5.

DETAILED DESCRIPTION OF THE INVENTION

Figure 3:
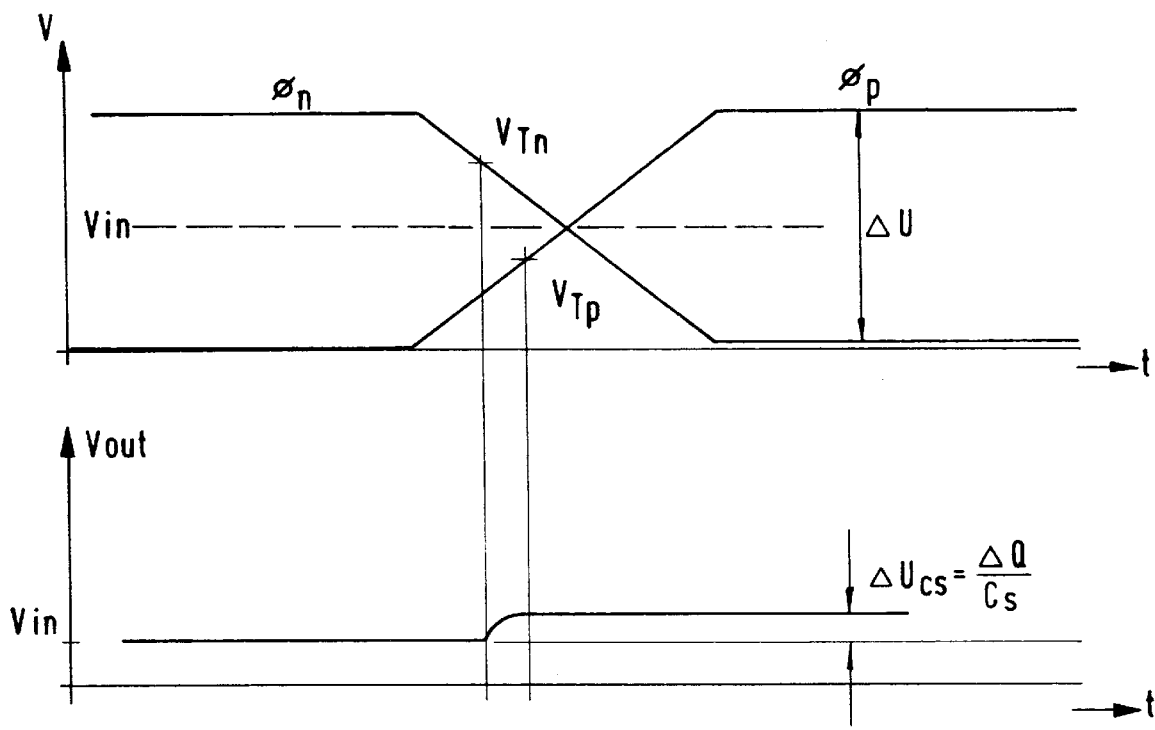
FIG. 3 shows a waveform diagram for elucidating the problems of the known circuits with switching transistors controlled in complementary manner.
Figure 4:
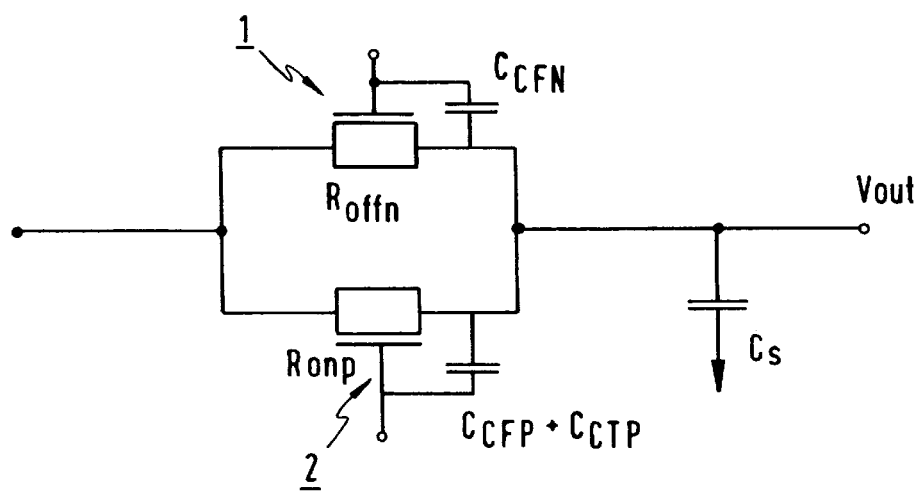
FIG. 4 shows an equivalent circuit diagram for the switch according to FIG. 1a at the switching moment.

As can be seen from a comparison with FIG. 3, the descending edge of switching pulse øn is delayed in time with respect to the ascending edge of switching pulse øp. This is achieved by a control operation of the edge of the switching pulse train øn, as will be elucidated in more detail hereinafter. The non-controlled, non-delayed edge of switching pulse øn is indicated in broken line.

As can be seen from the waveform diagram in FIG. 5, a level change of switching pulse øp takes place first at the time t1. As seen at the bottom in FIG. 5, $V_{out}$ increases in relation to $V_{in}$, but only until switching pulse on begins to decrease. The two switching thresholds $V_{Tn}$ and $V_{Tp}$ are reached shortly after each other, at the time t3 and t4, respectively. In the time interval between t3 and t4, the n-channel or, respectively, switching transistor 1 in FIG. 1a is blocked, and there is no compensation taking place for the p-channel or switching transistor 2, respectively. After the time t4, the p-channel then is blocked as well, and only compensation of the CF-contents takes place. Between the times t5 and t6, the charge compensation for the p-channel takes place finally, since the edge of signal øn is delayed with respect to that of signal øp.

Figure 6:
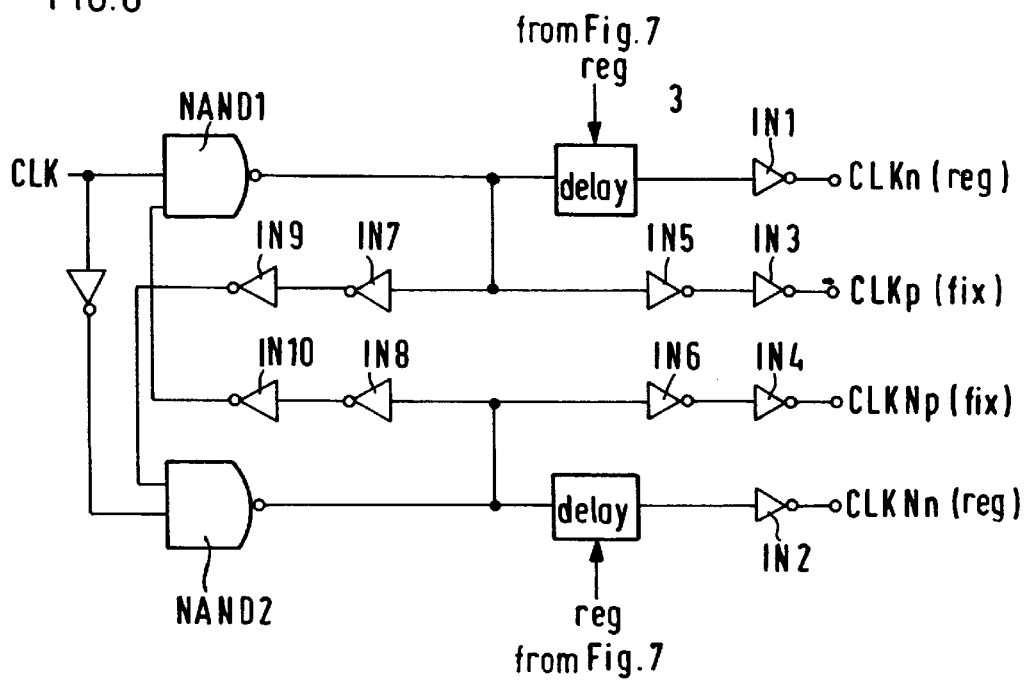
FIG. 6 shows a block diagram of a switching pulse generator according to the invention.

For obtaining the mode of operation elucidated above, the switching pulse generator shown in FIG. 6 is utilized.

A basic clock signal CLK is applied to a NAND gate NAND1, and at the same time the inverted signal of CLK is applied to a NAND gate NAND2. The output signal of NAND1 is fed via a delay member 3 and an inverter IN1 to a clock output for the signal CLKn. As will still be elucidated below, this clock signal or switching pulse signal is controlled by a control or regulating signal "reg" which is generated by the circuit according to FIG. 7 to be elucidated further below.

The output signal of NAND1, furthermore, is applied via two inverters IN7 and IN9 to a second input of NAND2. The second input of NAND1 furthermore receives the output signal of NAND2 via two inverters IN8 and IN10.

The signal complementary to signal CLKn or inverted signal is obtained as signal CLKNn, namely as a regulated switching pulse signal at the output of an inverter IN2 having an additional delay member 4 connected upstream thereof which in turn is connected to the output of NAND2.

Via a series connection of two inverters IN3 and IN5, a non-controlled switching pulse signal CLKp is formed of the output signal of NAND1. Via two inverters IN6 and IN4, a non-controlled clock signal or switching pulse signal CLKNp is formed of the output signal of NAND2.

FIG. 2 shows the input and output signals depicted in FIG. 6, indicating in particular that the trailing edge of signal CLKn is regulated as compared to CLKp and that CLKNn is regulated as compared to CLKNp.

Figure 7:
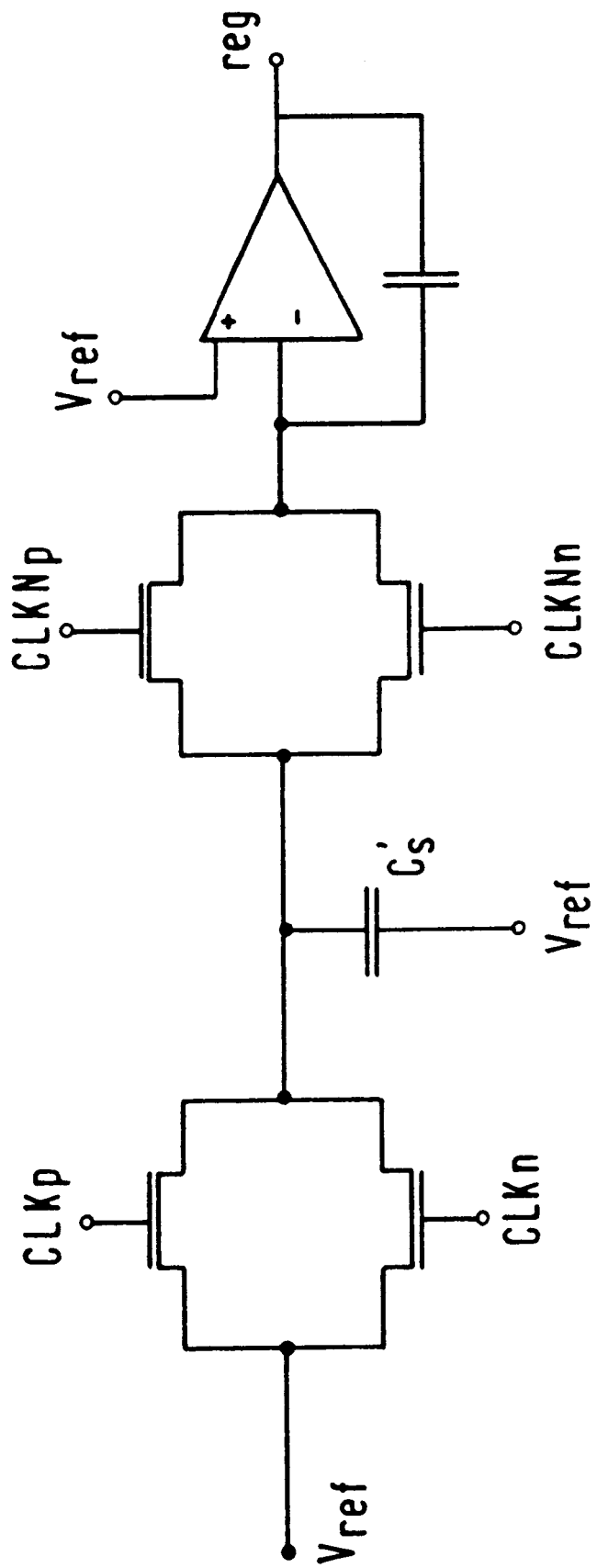
FIG. 7 shows a dummy structure of an electric circuit serving to obtain a control signal for two delay members in the circuit according to FIG. 6.

FIG. 7 shows a sketch of a circuit for obtaining the control signal "reg" depicted in FIG. 6 as input signal for delay members 3 and 4. The circuit shown in FIG. 7 basically is composed like the electric circuit according to FIG. 1b in which switching capacitor $C_s$ can be switched in the input circuit of an operational amplifier of the filter circuit. The circuit shown in FIG. 7 contains the two switches in the input circuit and output circuit, respectively, of capacitor $C_s$, as well as the operational amplifier, and instead of the input voltage Vin in FIG. 1b a fixed reference voltage Vref is applied on the input side.

The output signals of switching pulse generator according to FIG. 6 are fed to the switching transistors in the manner shown in FIG. 7. Due to this, a control signal for the two delay members 3 and 4 of FIG. 6 is obtained at the output of the circuit according to FIG. 7. When signal "reg" increases, switching pulse CLKn is delayed in a correspondingly great extent, with the consequence that the amplitude of the control signal "reg" thus decreases, and thus also the delay effected by delay member 3 in FIG. 6 becomes smaller. The same holds in corresponding manner for the inverted signal CLKNn.

By the edge control of the switching pulse train for switching pulse signal CLKn and CLKNn, respectively, according to the invention, the generation of offset voltages at the switched capacitor is avoided.

In a modification of the embodiment described hereinbefore, the signal CLKp and CLKNp, respectively, of course could also be subjected to edge control as an alternative.

What is claimed is:

1. A method of operating an electric circuit containing a switched capacitor that is switched by complementary electronic switches which are electrically arranged in parallel to each other and are controlled by complementary switching pulse signals, comprising:
  controlling the timing of the leading edge and/or the trailing edge of at least one of the complementary switching pulse signals in such a manner that it is shifted in accordance with the output voltage of the mutually parallel switches with respect to the associated edge of the other one of the complementary switching pulse signals.

2. The method of claim 1, wherein the electronic switches are complementary MOS-FETs.

3. The method of claim 1 wherein, the edges are shifted in time.

4. The method of claim 1 wherein, the edge is shifted such that both switches reach the blocking state substantially at the same time.

5. An electric circuit, comprising:
  at least one switched capacitor which is switched via a first parallel circuit of complementary first and second switches controlled by complementary first and second switching pulse trains;
  a switching pulse generator receiving a basic clock signal and generating the first and second switching pulse trains;
  a control circuit coupled to the switched capacitor and structured to receive the two switching pulse trains and, using a reference signal, deliver a control signal; and
  a delay circuit within the switching pulse generator, which receives the control signal and delays the first and/or second switching pulse train in accordance with the control signal.

6. The circuit of claim 5, wherein the delay circuit is arranged in an output circuit provided for the first switching pulse train.

7. The circuit of claim 5 wherein the control circuit designed as a dummy structure of the electric circuit containing the switched capacitor includes:
  a second parallel circuit of complementary third and fourth switches coupled between the switched capacitor and a connection node; and
  an operational amplifier having a first input coupled to the connection node. a second input coupled to the reference signal, and an output at which the control signal is produced.

8. The circuit of claim 5 wherein the delay circuit is a first delay circuit that delays the first switching pulse train based on the control signal and the switching pulse generator further includes a second delay circuit that delays the second switching pulse train based on the control signal.

9. The circuit of claim 8 wherein the switching pulse generator includes:
  an input node at which the basic clock signal is received;
  a first logic gate having first and second inputs and an output, the first input being coupled to the input node and the output being coupled to the first delay circuit;
  an inverter coupled to the input node;
  a second logic gate having a first input coupled to the input node through the inverter, a second input coupled to the output of the first logic gate, and an output coupled to the second delay circuit and the second input of the first logic gate.

10. The circuit of claim 9 wherein the switching pulse generator includes a first pair of inverters coupled between the output of the first logic gate and the second input of the second logic gate and a second pair of inverters coupled between the output of the second logic gate and the second input of the first logic gate.

11. A switched capacitor circuit, comprising:
  a capacitor;
  a first parallel circuit of complementary first and second switches mutually coupled to the capacitor, the first and second switches being controlled by complementary first and second switching pulse trains;
  a control circuit structured to receive the switching pulse trains and deliver a control signal; and
  a switching pulse generator that receives a basic clock signal and generates the first and second switching pulse trains, the switching pulse generator including a first delay circuit that receives the control signal and delays the first switching pulse train in accordance with the control signal.

12. The circuit of claim 11 wherein the control circuit includes:
  a second parallel circuit of complementary third and fourth switches coupled between the capacitor and a connection node; and
  an operational amplifier having a first input coupled to the connection node, a second input coupled to a reference voltage, and an output at which the control signal is produced.

13. The circuit of claim 12 wherein the capacitor is coupled between an output of the first parallel circuit and a reference node at which the reference voltage is produced and the second input of the operational amplifier is coupled to the reference node.

14. The circuit of claim 11 wherein the delay circuit is a first delay circuit that delays the first switching pulse train based on the control signal and the switching pulse generator further includes a second delay circuit that delays the second switching pulse train based on the control signal.

15. The circuit of claim 14 wherein the switching pulse generator includes:

an input node at which the basic clock signal is received;

a first logic gate having first and second inputs and an output, the first input being coupled to the input node and the output being coupled to the first delay circuit;

an inverter coupled to the input node;

a second logic gate having a first input coupled to the input node through the inverter, a second input coupled to the output of the first logic gate, and an output coupled to the second delay circuit and the second input of the first logic gate.

16. The circuit of claim 15 wherein the switching pulse generator includes a first pair of inverters coupled between the output of the first logic gate and the second input of the second logic gate and a second pair of inverters coupled between the output of the second logic gate and the second input of the first logic gate.

17. The circuit of claim 11 wherein the control circuit includes an input coupled to the switched capacitor and an output of the first parallel circuit.

* * * * *

UNITED STATES PATENT AND TRADEMARK OFFICE
CERTIFICATE OF CORRECTION

| | |
|---|---|
| PATENT NO. | : 6,191,631 B1 |
| DATED | : February 20, 2001 |
| INVENTOR(S) | : Jörg Schambacher et al. |

It is certified that error appears in the above-identified patent and that said Letters Patent is hereby corrected as shown below:

<u>Column 6,</u>
Lines 11, 12 and 13, "The circuit of claim 5 wherein the control circuit designed as a dummy structure of the electric circuit containing the switched capacitor includes:" should read as -- The circuit of claim 5 wherein the control circuit includes: -- in the issued patent.

Signed and Sealed this

Sixteenth Day of July, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.     : 6,191,631 B1                                                                Page 1 of 1
DATED          : February 20, 2001
INVENTOR(S)    : Jörg Schambacher et al.

It is certified that error appears in the above-identified patent and that said Letters Patent is hereby corrected as shown below:

<u>Title page,</u>
Item [73], "STMicroelectronics, S.r.l., Agrate Brianza (IT)" should read as
-- STMicroelectronics GmbH, Grasbrunn (DE) --.

Signed and Sealed this

Third Day of December, 2002

JAMES E. ROGAN
*Director of the United States Patent and Trademark Office*